US012575279B2

(12) United States Patent
Wang et al.

(10) Patent No.: US 12,575,279 B2
(45) Date of Patent: Mar. 10, 2026

(54) DISPLAY PANEL, DISPLAY APPARATUS, AND MANUFACTURE METHOD

(71) Applicants:Chengdu BOE Optoelectronics Technology Co., Ltd., Sichuan (CN); BOE Technology Group Co., Ltd., Beijing (CN)

(72) Inventors: Qian Wang, Beijing (CN); Wei Deng, Beijing (CN); Yue Wei, Beijing (CN); Yuqing Yang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 797 days.

(21) Appl. No.: 17/797,837

(22) PCT Filed: Nov. 15, 2021

(86) PCT No.: PCT/CN2021/130560
§ 371 (c)(1),
(2) Date: Aug. 5, 2022

(87) PCT Pub. No.: WO2022/179193
PCT Pub. Date: Sep. 1, 2022

(65) Prior Publication Data
US 2024/0206270 A1 Jun. 20, 2024

(30) Foreign Application Priority Data
Feb. 26, 2021 (CN) .......................... 202110220398.X

(51) Int. Cl.
*H10K 59/131* (2023.01)
*H10K 59/12* (2023.01)

(52) U.S. Cl.
CPC ..... *H10K 59/1315* (2023.02); *H10K 59/1201* (2023.02)

(58) Field of Classification Search
None
See application file for complete search history.

(56) References Cited

U.S. PATENT DOCUMENTS

2020/0098844 A1    3/2020  Bian
2020/0350388 A1    11/2020  Song et al.
(Continued)

FOREIGN PATENT DOCUMENTS

CN          110943104 A        3/2020
CN          111725266 A        9/2020
(Continued)

OTHER PUBLICATIONS

PCT/CN2021/130560 international search report and written opinion.
202110220398.X first office action dated Jun. 29, 2024.

*Primary Examiner* — Sue A Purvis
*Assistant Examiner* — Jordan M Klein
(74) *Attorney, Agent, or Firm* — IPro, PLLC

(57) ABSTRACT
A display panel, a display apparatus, and a manufacture method are provided. The display panel includes a transparent substrate, and a first display region and a second display region which are both located on the transparent substrate, wherein a plurality of first light-emitting device units arranged in array are provided in the first display region, a plurality of first driving units arranged in array are provided in the second display region, and each of the first driving units is connected to one of the first light-emitting device units via a connection wire, and drives the first light-emitting device unit to emit light; wherein the connection wire is manufactured on an inorganic protective layer.

16 Claims, 3 Drawing Sheets

(56)             References Cited

U.S. PATENT DOCUMENTS

| | | | | |
|---|---|---|---|---|
| 2021/0208633 A1* | 7/2021 | Ma | ........................ | H10K 59/131 |
| 2021/0255505 A1* | 8/2021 | Yin | .................... | G02F 1/133621 |
| 2021/0376024 A1* | 12/2021 | Zheng | .................... | H10K 77/10 |
| 2022/0069047 A1* | 3/2022 | Yang | .................... | H10K 59/131 |
| 2022/0310717 A1* | 9/2022 | Sun | ........................ | H10K 59/352 |
| 2022/0320238 A1* | 10/2022 | Liu | ........................ | H10K 59/121 |
| 2023/0209164 A1* | 6/2023 | Ye | ........................ | H04M 1/0264 |
| | | | | 348/374 |

FOREIGN PATENT DOCUMENTS

| | | |
|---|---|---|
| CN | 113013215 A | 6/2021 |
| WO | 2019006831 A1 | 1/2019 |

* cited by examiner

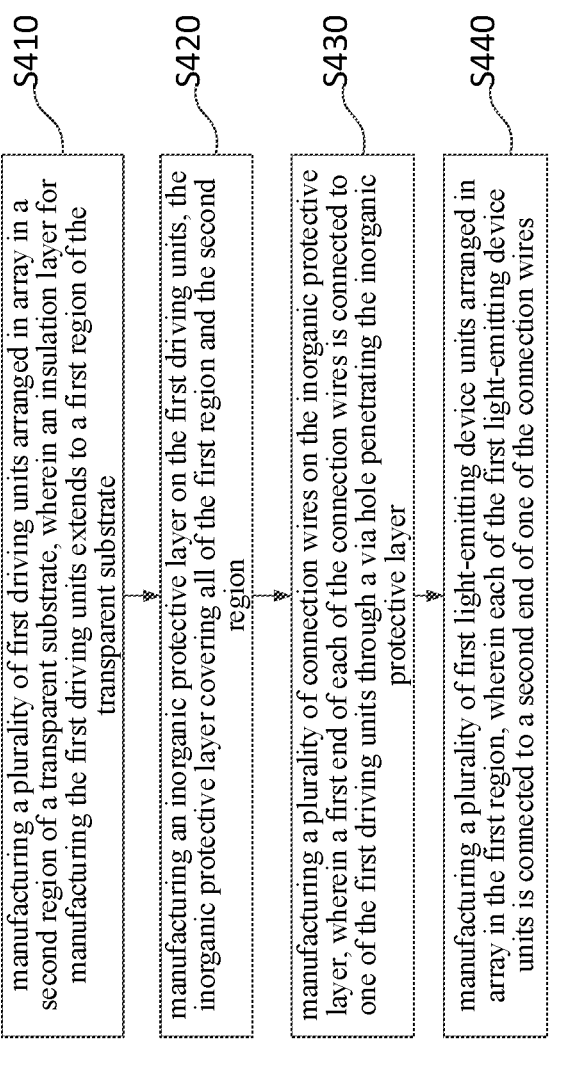

S410 manufacturing a plurality of first driving units arranged in array in a second region of a transparent substrate, wherein an insulation layer for manufacturing the first driving units extends to a first region of the transparent substrate

S420 manufacturing an inorganic protective layer on the first driving units, the inorganic protective layer covering all of the first region and the second region

S430 manufacturing a plurality of connection wires on the inorganic protective layer, wherein a first end of each of the connection wires is connected to one of the first driving units through a via hole penetrating the inorganic protective layer

S440 manufacturing a plurality of first light-emitting device units arranged in array in the first region, wherein each of the first light-emitting device units is connected to a second end of one of the connection wires

Fig. 4

DISPLAY PANEL, DISPLAY APPARATUS, AND MANUFACTURE METHOD

CROSS-REFERENCE TO RELATED APPLICATIONS

The present application is the U.S. national phase of PCT Application No. PCT/CN2021/130560 filed on Nov. 15, 2021, which claims a priority to a Chinese patent application No. 202110220398.X filed on Feb. 26, 2021, the disclosures of which are incorporated herein by reference in their entireties.

TECHNICAL FIELD

The present disclosure relates to the field of display technology, and more particularly to a display panel, a display apparatus and a manufacture method.

BACKGROUND

With the market's developing demand for full screen display, the camera integrated under the display panel has become the main trend of current structure design of display apparatus.

For a camera integrated under a display panel, in order to realize a photographing function, it is required that a region of the display panel that corresponds to the camera is set as a display region pervious to light. Based on this structural requirement, the display panel generally includes a camera region, a normal display region surrounding the camera region, and a transitional region located between the normal display region and the camera region, and in order to ensure the normal display function and the light transmission function of the camera region simultaneously, a light-emitting device unit of the camera region is connected via an indium tin oxide (ITO) wire to a driving unit located at the transitional region, and emits light when driven by the driving unit located at the transitional region.

In conventional technology, an ITO wire is manufactured on an organic substrate which is a planarization layer. However, the bonding force between the ITO wire film layer manufactured on the organic substrate and the organic substrate is poor, thus the ITO wire film layer tends to peel off; moreover, the organic substrate tends to outgas in a vacuum environment, which affects the deposition of the film, so that the resistivity of the ITO wire manufactured on the organic substrate is relatively large. At the same time, carbon atoms dissociated from polymer chains in the organic substrate subject to particle bombardment would combine with the film layer to generate compounds, resulting in blackening of the substrate, which seriously affects the service life and luminous efficiency of the under-screen camera products.

SUMMARY

An embodiment of the present disclosure provides a display panel including a transparent substrate and a first display region and a second display region which both are located on the transparent substrate, wherein the first display region is provided with a plurality of first light-emitting device units arranged in array, and the second display region is provided with a plurality of first driving units arranged in array, wherein, each of the first driving units is connected to one of the first light-emitting device units via a connection wire, and drives the first light-emitting device unit to emit light; wherein the connection wire is made on an inorganic protective layer.

Optionally, in the display panel, a planarization layer is formed on a side of the connection wire away from the transparent substrate, and the planarization layer is attached to the connection wire and covers all of the first display region and the second display region.

Optionally, in the display panel, the first light-emitting device units each include a first anode, a first cathode, and a first light-emitting layer located between the first anode and the first cathode, and the first anode, the first cathode and the first light-emitting layer are provided on a side of the planarization layer away from the transparent substrate; the first driving units each include a first active layer, a first gate electrode and a first source/drain electrode layer, and the first active layer, the first gate electrode and the first source/drain electrode layer are provided between the transparent substrate and the inorganic protective layer;

wherein the connection wire is connected to a source electrode or a drain electrode of the first source/drain electrode layer through a first via hole penetrating the inorganic protective layer, and the first anode is connected to the connection wire through a second via hole penetrating the planarization layer.

Optionally, the display panel further includes a third display region disposed around the first display region, and the second display region is disposed between the first display region and the third display region;

wherein a plurality of pixel structures arranged in array are provided in the third display region, and each of the pixel structures includes a second light-emitting device unit and a second driving unit;

a distribution density of the plurality of pixel structures in the third display region is greater than a distribution density of the plurality of the first light-emitting device units in the first display region.

Optionally, in the display panel, the second driving unit includes a second active layer, a second gate electrode, and a second source/drain electrode layer disposed in sequence between the transparent substrate and the second light-emitting device unit, wherein the inorganic protective layer extends to the third display region and covers the third source/drain electrode layer.

Optionally, in the display panel, a planarization layer is provided on a side away from the inorganic protective layer in the third display region, and the second light-emitting device unit includes a second anode, a second light-emitting layer and a second cathode which are provided on a side of the planarization layer away from the transparent substrate and are arranged in sequence, wherein the second anode is connected to a source electrode or a drain electrode of the second source/drain electrode layer through a third via hole penetrating the planarization layer and the inorganic protective layer.

Optionally, in the display panel, a plurality of pixel structures arranged in array are further provided in the second display region, and a distribution density of the plurality of pixel structures in the second display region is less than the distribution density of the plurality of pixel structures in the third display region.

Optionally, in the display panel, the inorganic protective layer is a silicon oxide layer.

An embodiment of the present disclosure further provides a display apparatus including the aforementioned display panel.

An embodiment of the present disclosure further provides a manufacture method, wherein the method is applied to the aforementioned display panel, and includes;

manufacturing a plurality of first driving units arranged in array in a second region of a transparent substrate, wherein an insulation layer for manufacturing the first driving units extends to a first region of the transparent substrate;

manufacturing an inorganic protective layer on the first driving units, the inorganic protective layer covering all of the first region and the second region;

manufacturing a plurality of connection wires on the inorganic protective layer, wherein a first end of each of the connection wires is connected to one of the first driving units through a via hole penetrating the inorganic protective layer;

manufacturing a plurality of first light-emitting device units arranged in array in the first region, wherein each of the first light-emitting device units is connected to a second end of one of the connection wires.

Optionally, after manufacturing the plurality of connection wires on the inorganic protective layer, the method further includes:

manufacturing a planarization layer on the connection wires, the planarization layer covering all of the first region and the second region;

wherein the plurality of first light-emitting device units are manufactured on the planarization layer, and each of the plurality of first light-emitting device units is connected to the second end of one of the connection wires through a via hole penetrating the first light-emitting device unit.

Optionally, the method further includes:

in parallel with the manufacturing the plurality of first driving units arranged in array in the second region of the transparent substrate, manufacturing a plurality of second driving units arranged in array in a third region of the transparent substrate, wherein when the inorganic protective layer is manufactured on the first driving units, the manufactured inorganic protective layer also extends to cover the plurality of second driving units;

in parallel with the manufacturing the plurality of first light-emitting device units arranged in array in the first region of the transparent substrate, manufacturing a plurality of second light-emitting device units arranged in array in the third region.

Optionally, in the manufacture method, the manufacturing the plurality of connection wires on the inorganic protective layer includes:

manufacturing a plurality of connection wires by using an ITO sputtering film-forming process, and performing oxygen UV irradiation and oxygen plasma processes during the sputtering process.

BRIEF DESCRIPTION OF THE DRAWINGS

In order to more clearly explain the embodiments of the present disclosure or the technical solutions in the related art, a brief description will be given below with reference to the accompanying drawings to be used in the description of the embodiments, and it is obvious that the drawings in the description below are only some embodiments of the present disclosure, and other drawings can be obtained from these drawings by a person skilled in the art without any inventive effort.

FIG. 4 is a schematic flow chart illustrating a method of manufacturing a display panel according to an embodiment of the present disclosure.

DETAILED DESCRIPTION

In order that the technical problems, technical solutions and advantages to be solved by the present disclosure can be more clearly understood, a detailed description will be given below with reference to the accompanying drawings and specific embodiments.

In order to solve the problems in the prior art of a display panel using an under-screen camera that a film layer of an ITO wire tends to peel off, the resistivity is large and blackening of a substrate tends to occur, an embodiment of the present disclosure provides a display panel, such that a connection wire connected to a light-emitting device unit provided in a light-transmitting region for the camera is manufactured on an inorganic protective layer, so as to increase the bonding force with the connection wire, reduce the resistivity and avoid the problem of substrate blackening.

In order to clearly explain the structure of the display panel according to the embodiment of the present disclosure, the regional distribution of the display panel according to the embodiment of the present disclosure will be described with reference to FIG. 1 and FIG. 2.

Figures 1, 2:
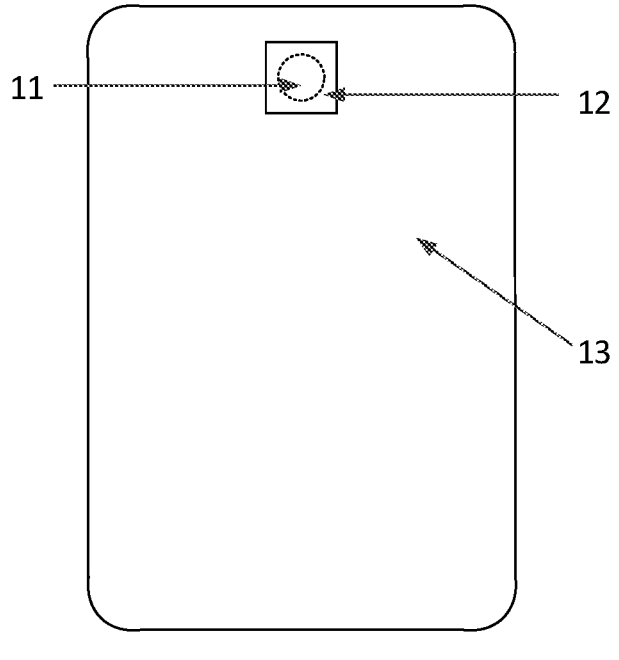
FIG. 1 is a schematic plan view of a display panel according to an embodiment of the present disclosure.
FIG. 2 is a schematic structural diagram illustrating a distribution of device units in different display regions of the display panel according to an embodiment of the present disclosure.

As shown in FIG. 1 and FIG. 2, the display panel according to the embodiment of the present disclosure includes a first display region 11, a second display region 12, and a third display region 13.

Optionally, the first display region 11 and the second display region 12 are formed as light-transmitting display regions, wherein when the display panel is installed in an electronic device, a photosensitive element such as a camera may be installed inside the electronic device at a position corresponding to the position of the first display region 11, for capturing an image through the first display region 11, to form a display structure with an under-screen camera.

Optionally, a third display region 13 is provided around the first display region 11, a second display region 12 is located between the first display region 11 and the third display region 13, and the second display region 12 is connected to the first display region 11 and the third display region 13 and is formed as a transitional region between the first display region 11 and the third display region 13. The first display region 11, the second display region 12, and the third display region 13 combine to form the entire display region of the display panel.

Optionally, the entire display region of the display panel may be a light-transmitting display region, or only the first display region 11 and the second display region 12 combine to form the light-transmitting display region of the display panel, in order to realize image acquisition of the under-screen camera. In one implementation, the display panel is an organic light emitting diode (OLED) display panel.

In an embodiment of the present disclosure, optionally, the first display region 11, the second display region 12 and the third display region 13 are manufactured on a transparent substrate.

In addition, as shown in FIG. 2, on the display panel according to an embodiment of the present disclosure, a plurality of first light-emitting device units 100 arranged in array are provided in the first display region 11, and a plurality of first driving units 200 arranged in array are provided in the second display region 12.

Optionally, in order to form an under-screen camera display structure, in the first display region 11, a plurality of first light-emitting device units 100 are made of a light-transmitting material so as to achieve a light-transmitting effect of the first display region 11; optionally, the first light-emitting device units 100 are not limited to being made of the light-transmitting material, instead the light-transmitting effect of the first display region 11 may be achieved by using a light-transmitting function of gaps between the plurality of first light-emitting device units 100 spaced apart from each other.

Optionally, in the second display region 12, a plurality of first driving units 200 are made of a light-transmitting material to achieve a light-transmitting effect of the second display region 12; of course, optionally, the first driving units 200 are not limited to being made of the light-transmitting material, instead the light-transmitting effect of the second display region 12 may be achieved by using a light-transmitting function of gaps between the plurality of first driving units 200 spaced apart from each other.

In an embodiment of the present disclosure, each of the first driving units 200 of the second display region 12 is connected to one of the first light-emitting device units 100 via a connection wire 300, and the corresponding first light-emitting device unit 100 can be driven by the first driving unit 200 to emit light.

Optionally, in an embodiment of the present disclosure, the display panel is an OLED display panel, the first light-emitting device unit 100 is an OLED light-emitting unit in an OLED pixel unit, and the first driving unit 200 is a driving unit for driving the OLED light-emitting unit to emit light in the OLED pixel unit.

With the display panel described in this embodiment, the first light-emitting device units 100 are distributed in a different region than that of the first driving units 200 for driving the first light-emitting device units 100 to emit light, so as to satisfy the light transmission functional requirements of the first display region 11 and the second display region 12; in addition, the plurality of first light-emitting device units 100 and the plurality of first driving units 200 are connected in a one-to-one manner to realize light emission of the first light-emitting device units 100 of the first display region 11, so as to display an image in the first display region 11. Optionally, a plurality of pixel structures 400, i.e., pixel units, arranged in array are further provided in the second display region 12 and the third display region 13, respectively. The second display region 12 and the third display region 13 can realize image display by means of the pixel structures 400.

In one implementation, optionally, the distribution density of the plurality of pixel structures 400 disposed in the second display region 12 is less than the distribution density of the plurality of pixel structures 400 disposed in the third display region 13. The third display region 13 is formed as a normal display region of the display panel, and the second display region 12 can be formed as a light-transmitting display region by utilizing gaps between the plurality of pixel structures 400, or manufacturing the pixel structures 400 and the first driving unit 200 in the second display region 12 by using a light-transmitting material, thereby satisfying the requirements for displaying an image and transmitting light.

Furthermore, the distribution density of the plurality of first light-emitting device units 100 arranged in the first display region 11 is less than the distribution density of the plurality of pixel structures 400 in the third display region 13. By utilizing gaps between the plurality of first light-emitting device units 100, or making the plurality of first light-emitting device units 100 in the first display region 11 by using a light-transmitting material, the first display region 11 can be formed as a light-transmitting display region, thereby satisfying the requirements for displaying an image and transmitting light.

Figure 3:
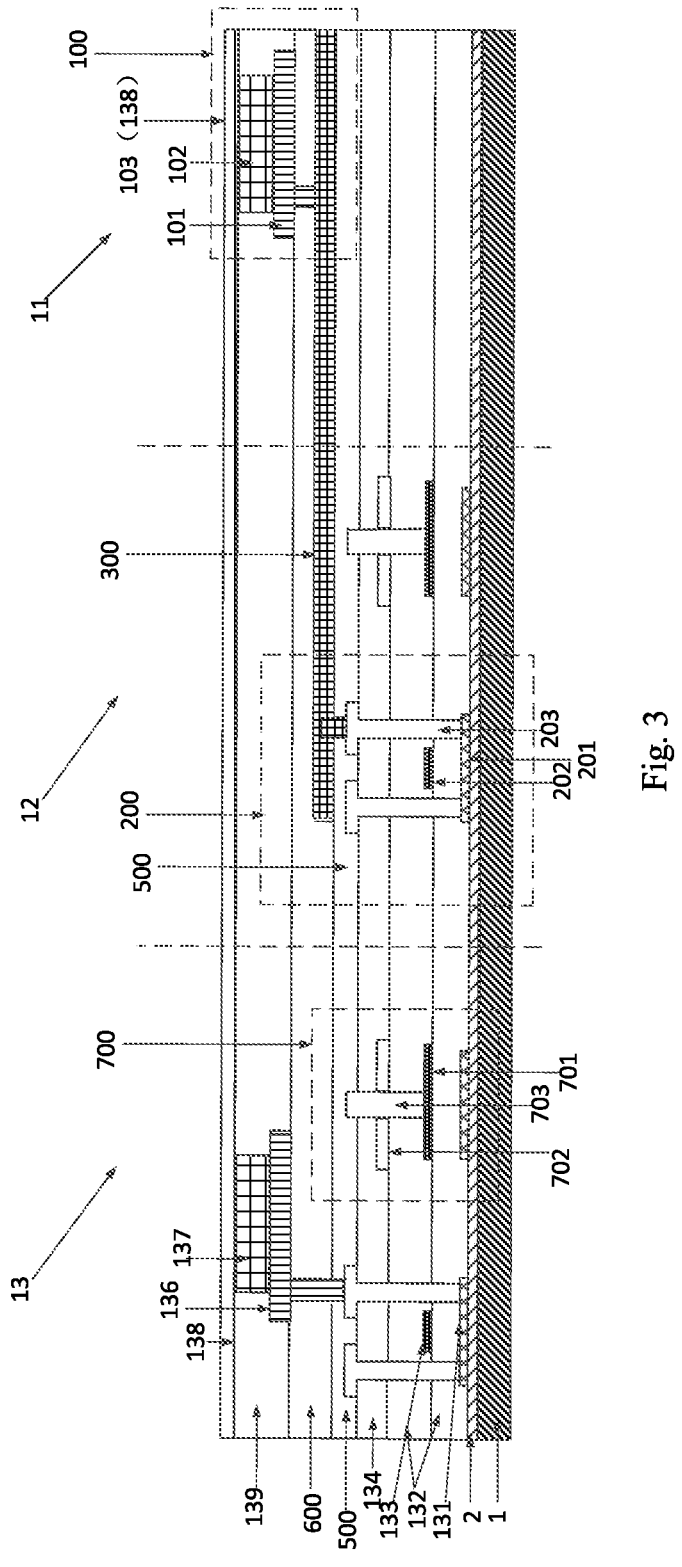
FIG. 3 is a schematic cross-sectional view illustrating a display panel according to an embodiment of the present disclosure.

FIG. 3 is a schematic diagram showing a cross-sectional structure of a display panel according to an embodiment of the present disclosure. As shown in FIG. 3, in the first display region 11 and the second display region 12, a connection wire 300 is connected to a first light-emitting device unit 100 of the first display region 11 and a first driving unit 200 of the second display region 12.

In the display panel according to an embodiment of the present disclosure, the connection wire 300 is manufactured on the inorganic protective layer 500, that is, when the display panel is manufactured, the connection wire 300 is manufactured using the inorganic protective layer 500 as a substrate. Optionally, the connection wire 300 is made of a transparent ITO material.

It should be noted that, in the display panel of the conventional technology, the ITO wire film layer is formed on an organic material substrate, the bonding force between the ITO wire film layer formed on the organic material substrate and the substrate is poor, the ITO wire film layer tends to peel off, and there is a problem that the resistivity of the ITO wire is relatively large, and there is also a problem that carbon atoms dissociated from polymer chains in the organic material substrate subject to particle bombardment would combine with the film layer to generate compounds, resulting in blackening of the substrate. According to the display panel described in the embodiments of the present disclosure, owing to manufacturing a connection wire on the inorganic protective layer 500, that is, using the inorganic protective layer 500 with better compactness as a substrate to fabricate the connection wire 300, the bonding force between the connection wire 300 and the inorganic protective layer 500 is better, the peeling of the connection wire 300 is greatly reduced, and the problems of outgassing, black spots, increased resistivity and the like of the organic polymer material during manufacture of the connection wire 300 can be avoided.

In an embodiment of the present disclosure, optionally, the inorganic protective layer is a silicon oxide (SiOx) layer.

The structure of each display region of the display panel according to an embodiment of the present disclosure will be described in detail with reference to FIG. 3.

The first display region 11, the second display region 12 and the third display region 13 are all manufactured on a transparent substrate 1, and are distributed in different regions on the transparent substrate 1.

As shown in FIG. 3, taking a top emission light-emitting device as an example, a buffer layer 2, a second driving unit and a second light-emitting device unit are sequentially manufactured on the transparent substrate 1 in the third display region 13 in a direction away from the transparent substrate 1, the second driving unit is connected to the second light-emitting device unit to form one pixel structure, and the second driving unit is used for driving the second light-emitting device unit to emit light.

Specifically, the second driving unit includes a second active layer 131, a gate insulation layer 132, a second gate electrode 133, an interlayer insulation layer 134, and a second source/drain electrode layer 135 which are arranged in sequence on the transparent substrate 1 in a direction away from the transparent substrate 1.

In an embodiment of the present disclosure, the inorganic protective layer 500 is provided on the second source/drain electrode layer 135, and a planarization layer 600 is manufactured on the inorganic protective layer 500.

The second light-emitting device unit includes a second anode 136, a second light-emitting layer 137, and a second cathode 138 which are sequentially provided on the planarization layer 600, and the second light-emitting layer 137 is provided in a pixel definition layer 139.

The second anode 136 is connected to a source electrode or a drain electrode of the second source/drain electrode layer 135 through a third via hole penetrating the planarization layer 600 and the inorganic protective layer 500, so that the second driving unit may drive the second light-emitting device unit to emit light.

In the second display region 12, a buffer layer 2 and a first driving unit 200 are sequentially formed on the transparent substrate 1 in a direction away from the transparent substrate 1. The first driving unit 200 includes a first active layer 201, a gate insulation layer 132, a first gate electrode 202, an interlayer insulation layer 134 and a first source/drain electrode layer 203 which are arranged in sequence on the transparent substrate 1 in a direction away from the transparent substrate 1. In an embodiment of the present disclosure, an inorganic protective layer 500 is formed on the first source/drain electrode layer 203, a connection wire 300 is formed on a side of the inorganic protective layer 500 that is away from the first source/drain electrode layer 203, and a planarization layer 600 is formed on a side of the connection wire 300 that is away from the inorganic protective layer 500.

Optionally, the gate insulation layer 132 of the third display region 13 extends to the second display region 12, to form the gate insulation layer 132 of the second display region 12; the interlayer insulation layer 134 of the third display region 13 extends to the second display region 12, to form the interlayer insulation layer 134 of the second display region 12. The inorganic protective layer 500 and the planarization layer 600 cover the first display region 11, the second display region 12 and the third display region 13 entirely.

In addition, the first active layer 201, the first gate electrode 202 and the first source/drain electrode layer 203 in the second display region 12 are the same layers as the second active layer 131, the second gate electrode 133 and the second source/drain electrode layer 135 in the third display region 13, respectively, and optionally can be made by using the same patterning processes.

In the first display region 11, a buffer layer 2, a gate insulation layer 132, an interlayer insulation layer 134, an inorganic protective layer 500, a connection wire 300 and a planarization layer 600, which extend from the second display region 12 to the first display region 11, are sequentially manufactured on the transparent substrate 1 in a direction away from the transparent substrate 1. A first light-emitting device unit 100 is manufactured on a side of the planarization layer 600 that is away from the transparent substrate 1. The first light-emitting device unit 100 includes a first anode 101, a first light-emitting layer 102 and a first cathode 103 which are arranged in sequence on a side of the planarization layer 600 that is away from the transparent substrate 1, and the second light-emitting layer 102 is arranged in the pixel definition layer 139. Optionally, the second cathode 138 can extend to the first display region 11 to form the first cathode 103; of course, the first cathode 103 and the second cathode 138 may be different patterns of the same pattern layer.

Here, referring to FIG. 3, in the second display region 12, a connection wire 300 is connected to a source electrode or a drain electrode of the first source/drain electrode layer 203 through a first via hole penetrating the inorganic protective layer 500, and the first anode 101 is connected to the connection wire 300 through a second via hole penetrating the planarization layer 600.

In an embodiment of the present disclosure, optionally, the first anode 101, the first light-emitting layer 102 and the first cathode 103 of the first display region 12 are provided in the same layers as the second anode 136, the second light-emitting layer 137 and the second cathode 138 of the third display region 13, respectively, and are manufactured using the same patterning processes.

In an embodiment of the present disclosure, FIG. 3 is a schematic structural view for illustrating a connection wire 300 connecting a first light-emitting device unit 100 of a first display region 12 and a second driving unit 200 of a second display region 12. According to FIG. 2, in addition to a plurality of second driving units 200 arranged in array, a plurality of pixel structures arranged in array can also be provided in the second display region 12, and the structure of the provided pixel structures is the same as that of the pixel structures provided in the third display region 13, and each layer is made by using the same patterning process, which will not be described in detail herein.

It should be noted that, both the second display region 12 and the third display region 13 are provided with a capacitor structure 700 for providing the pixel structure with a light emission phase voltage. The capacitor structure 700 includes a first electrode layer 701 and a second electrode layer 702 which are oppositely arranged, as well as a signal transmission layer 703 connected to the first electrode layer 701. Optionally, the first electrode layer 701 is arranged in the same layer as the first gate electrode 202 and the second gate electrode 133, and can be made using the same patterning process; and the gate insulation layer 132 can be provided as two layers, wherein the first electrode layer 701 can be arranged on a first gate insulation layer of the gate insulation layer 132 that is close to the transparent substrate 1, and the second electrode layer 702 can be arranged on a second gate insulation layer that is away from the transparent substrate 1, thereby forming an oppositely-arranged structure. The signal transmission layer 703 is the same layer as the first source/drain electrode layer 203 and the second source/drain electrode layer 135, and is made by using the same patterning process; and the signal transmission layer 703 is connected to the first electrode layer 701 through a via hole penetrating the interlayer insulation layer 134 and the second gate insulation layer.

With the display panel described in this embodiment, as shown in FIG. 3, the inorganic protective layer 500 covers and is manufactured on the source/drain electrode layer of the driving units in entire display region of the display panel, and on this basis, in the second display region 12 and the third display region 13, a connection wire 300 is manufactured using the inorganic protective layer 500 as a substrate. By manufacturing the connection wire 300 on the inorganic protective layer 500, the peeling of the connection wire 300 can be greatly reduced, and problems such as outgassing, black spots, and increased resistivity of the organic polymer material during manufacture of the connection wire 300 can be avoided.

In the display panel according to an embodiment of the present disclosure, optionally, the fabrication of the connection wire 300 may utilize an ITO sputtering film-forming process, and oxygen UV irradiation and oxygen plasma process are performed during the sputtering for reducing the resistivity of the connection wire 300 made of ITO and greatly increasing the bonding with the inorganic protective layer 500.

With the display panel according to an embodiment of the present disclosure, it is demonstrated by experiments that using the inorganic protective layer as the substrate for the connection wire 300 can also significantly reduce water and oxygen corrosion.

In addition, the resistivity of the connection wire 300 made of ITO is associated with the ITO sheet resistance, the thickness of the ITO connection wire, the width of the ITO connection wire, and the like. For example, when the width is 2.4, and the sheet resistance Spec<2135, the thickness of the ITO connection wire may be between 150 angstrom (Å) and 200 Å. With the display panel according to embodiments of the present disclosure, the resistivity of the ITO connection wire can be reduced compared to those conventional connection wires manufactured on an organic layer, further making it possible to reduce the thickness of the ITO connection wires if the resistivity remains the same.

An embodiment of the present disclosure also provides, in another aspect, a display apparatus including a display panel of the above-described structure. With reference to the above detailed description in conjunction with FIG. 1 to FIG. 3, those skilled in the art will be able to understand the specific structure of the display apparatus using the display panel according to the embodiments of the present disclosure, the specific structure will not be described in detail herein.

An embodiment of the present disclosure further provides, in another aspect, a manufacture method applied to the display panel as described in any one of the foregoing embodiments. As shown in FIG. 4, the method includes following steps:

S410, manufacturing a plurality of first driving units arranged in array in a second region of a transparent substrate, wherein an insulation layer for manufacturing the first driving units extends to a first region of the transparent substrate;

S420, manufacturing an inorganic protective layer on the first driving units, the inorganic protective layer covering all of the first region and the second region;

S430, manufacturing a plurality of connection wires on the inorganic protective layer, wherein a first end of each of the connection wires is connected to one of the first driving units through a via hole penetrating the inorganic protective layer; and S440, manufacturing a plurality of first light-emitting device units arranged in array in the first region, wherein each of the first light-emitting device units is connected to a second end of one of the connection wires.

Optionally, the manufacture method further includes:

in parallel with the manufacturing the plurality of first driving units arranged in array in the second region of the transparent substrate, manufacturing a plurality of second driving units arranged in array in a third region of the transparent substrate; when the inorganic protective layer is manufactured on the first driving units, the manufactured inorganic protective layer also extends to cover the plurality of second driving units;

in parallel with the manufacturing the plurality of first light-emitting device units arranged in array in the first region of the transparent substrate, manufacturing a plurality of second light-emitting device units arranged in array in the third region.

In conjunction with FIG. 3, in the manufacture method according to an embodiment of the present disclosure, a first region, a second region and a third region on a transparent substrate are formed as a first display region 11, a second display region 12 and a third display region 13, respectively.

Optionally, in parallel with the manufacturing the plurality of first driving units arranged in array in the second region of the transparent substrate, a plurality of third driving units arranged in array are also manufactured in the second region; in parallel with the manufacturing the plurality of first light-emitting device units arranged in array in the first region of the transparent substrate, a plurality of third light-emitting device units arranged in array are further manufactured in the second region, wherein the plurality of third driving units are connected to the plurality of third light-emitting device units in a one-to-one manner, to form a plurality of pixel structures arranged in the second region.

In an embodiment of the present disclosure, optionally, after manufacturing a plurality of connection wires on the inorganic protective layer, the method further includes:

manufacturing a planarization layer on the connection wires, the planarization layer covering all of the first region and the second region;

wherein the plurality of first light-emitting device units are manufactured on the planarization layer, and each of the first light-emitting device units is connected to a second end of one of the connection wires through a via hole penetrating the first light-emitting device unit.

Optionally, the planarization layer also covers the third region.

In addition, it is noted, in step S410, also referring to FIG. 3, the insulation layer for manufacturing the first driving units includes a buffer layer, a gate insulation layer, an interlayer insulation layer, a pixel definition layer, and the like.

In an embodiment of the present disclosure, the specific structure of the first display region, the second display region and the third display region may be as shown in FIG. 3, wherein manufacture of each film layer may be performed by using a process such as exposure or evaporation, and will not be described in detail herein.

In the manufacture method according to the embodiments of the present disclosure, optionally, the fabrication of the connection wire may utilize an ITO sputtering film-forming process, and oxygen UV irradiation and oxygen plasma process are performed during the sputtering for reducing the resistivity of the connection wire made of ITO and greatly increasing the bonding with the inorganic protective layer.

While the foregoing is directed to the optional embodiments of the present disclosure, it will be understood by those skilled in the art that various changes may be made and equivalents may be substituted for elements thereof without departing from the principles of the disclosure, and these changes and equivalents should be deemed as falling in the scope of the present disclosure.

What is claimed is:

1. A display panel, comprising: a transparent substrate and a display region located on the transparent substrate, wherein the display region comprises a first display region and a second display region, a plurality of first light-emitting device units arranged in array are provided in the first display region, and a plurality of first driving units arranged in array are provided in the second display region, wherein each of the first driving units is connected to one of the first light-emitting device units via a connection wire, and drives the first light-emitting device unit to emit light, wherein the connection wire is manufactured on an inorganic protective layer, and the inorganic protective layer covers all of the display region, wherein a planarization layer is formed on a side of the connection wire away from the transparent substrate, and the planarization layer is attached to the connection wire and covers all of the first display region and the second display region, wherein the first light-emitting device units each comprise a first anode, a first cathode, and a first light-emitting layer located between the first anode and the first cathode, and the first anode, the first cathode and the first light-emitting layer are provided on a side of the planarization layer away from the transparent substrate; the first driving units each comprise a first active layer, a first gate electrode and a first source/drain electrode layer, and the first active layer, the first gate electrode and the first source/drain electrode layer are provided between the transparent substrate and the inorganic protective layer, and wherein the connection wire is connected to a source electrode or a drain electrode of the first source/drain electrode layer through a first via hole penetrating the inorganic protective layer, and the first anode is connected to the connection wire through a second via hole penetrating the planarization layer.

2. The display panel according to claim 1, wherein the display panel further comprises a third display region disposed around the first display region, and the second display region is disposed between the first display region and the third display region;

wherein a plurality of pixel structures arranged in array are provided in the third display region, and each of the pixel structures comprises a second light-emitting device unit and a second driving unit;

a distribution density of the plurality of pixel structures in the third display region is greater than a distribution density of the plurality of first light-emitting device units in the first display region.

3. The display panel according to claim 2, wherein the second driving unit comprises a second active layer, a second gate electrode and a second source/drain electrode layer which are arranged in sequence between the transparent substrate and the second light-emitting device unit, wherein the inorganic protective layer extends to the third display region and covers the second source/drain electrode layer.

4. The display panel according to claim 3, wherein a planarization layer is provided on a side away from the inorganic protective layer in the third display region, and the second light-emitting device unit comprises a second anode, a second light-emitting layer and a second cathode which are provided on a side of the planarization layer away from the transparent substrate and are arranged in sequence, wherein the second anode is connected to a source electrode or a drain electrode of the second source/drain electrode layer through a third via hole penetrating the planarization layer and the inorganic protective layer.

5. The display panel according to claim 2, wherein a plurality of pixel structures arranged in array are further provided in the second display region, and a distribution density of the plurality of pixel structures in the second display region is less than the distribution density of the plurality of pixel structures in the third display region.

6. The display panel according to claim 1, wherein the inorganic protective layer is a silicon oxide layer.

7. A manufacture method of the display panel according to claim 1, comprising:

manufacturing the plurality of first driving units arranged in array in the second region of the transparent substrate, wherein an insulation layer for manufacturing the first driving units extends to a first region of the transparent substrate;

manufacturing the inorganic protective layer on the first driving units, the inorganic protective layer covering all of the first region and the second region;

manufacturing the plurality of connection wires on the inorganic protective layer, wherein a first end of each of the connection wires is connected to one of the first driving units through a via hole penetrating the inorganic protective layer;

manufacturing the plurality of first light-emitting device units arranged in array in the first region, wherein each of the first light-emitting device units is connected to a second end of one of the connection wires.

8. The manufacture method according to claim 7, wherein after manufacturing the plurality of connection wires on the inorganic protective layer, the method further comprises:

manufacturing a planarization layer on the connection wires, the planarization layer covering all of the first region and the second region;

wherein the plurality of first light-emitting device units are manufactured on the planarization layer, and each of the plurality of first light-emitting device units is connected to the second end of one of the connection wires through a via hole penetrating the first light-emitting device unit.

9. The manufacture method according to claim 7, further comprising:

in parallel with the manufacturing the plurality of first driving units arranged in array in the second region of the transparent substrate, manufacturing a plurality of second driving units arranged in array in a third region of the transparent substrate, wherein when the inorganic protective layer is manufactured on the first driving units, the manufactured inorganic protective layer also extends to cover the plurality of second driving units;

in parallel with the manufacturing the plurality of first light-emitting device units arranged in array in the first region of the transparent substrate, manufacturing a plurality of second light-emitting device units arranged in array in the third region.

10. The manufacture method according to claim 7, wherein the manufacturing the plurality of connection wires on the inorganic protective layer comprises:

manufacturing the plurality of connection wires by using an indium tin oxide (ITO) sputtering film-forming process, and performing oxygen UV irradiation and oxygen plasma processes during the ITO sputtering film-forming process.

11. A display apparatus comprising a display panel, the display panel comprising: a transparent substrate and a display region located on the transparent substrate, wherein the display region comprises a first display region and a second display region, a plurality of first light-emitting device units arranged in array are provided in the first display region, and a plurality of first driving units arranged in array are provided in the second display region, wherein each of the first driving units is connected to one of the first light-emitting device units via a connection wire, and drives the first light-emitting device unit to emit light, wherein the connection wire is manufactured on an inorganic protective layer, and the inorganic protective layer covers all of the display region, wherein a planarization layer is formed on a side of the connection wire away from the transparent substrate, and the planarization layer is attached to the connection wire and covers all of the first display region and the second display region, wherein the first light-emitting device units each comprise a first anode, a first cathode, and a first light-emitting layer located between the first anode and the first cathode, and the first anode, the first cathode and the first light-emitting layer are provided on a side of the planarization layer away from the transparent substrate; the first driving units each comprise a first active layer, a first gate electrode and a first source/drain electrode layer, and the first active layer, the first gate electrode and the first source/drain electrode layer are provided between the transparent substrate and the inorganic protective layer, and wherein the connection wire is connected to a source electrode or a drain electrode of the first source/drain electrode layer through a first via hole penetrating the inorganic protective layer, and the first anode is connected to the connection wire through a second via hole penetrating the planarization layer.

12. The display apparatus according to claim 11, wherein the display panel further comprises a third display region disposed around the first display region, and the second display region is disposed between the first display region and the third display region;

wherein a plurality of pixel structures arranged in array are provided in the third display region, and each of the pixel structures comprises a second light-emitting device unit and a second driving unit;

a distribution density of the plurality of pixel structures in the third display region is greater than a distribution density of the plurality of first light-emitting device units in the first display region.

13. The display apparatus according to claim 12, wherein the second driving unit comprises a second active layer, a second gate electrode and a second source/drain electrode layer which are arranged in sequence between the transparent substrate and the second light-emitting device unit, wherein the inorganic protective layer extends to the third display region and covers the second source/drain electrode layer.

14. The display apparatus according to claim 13, wherein a planarization layer is provided on a side away from the inorganic protective layer in the third display region, and the second light-emitting device unit comprises a second anode, a second light-emitting layer and a second cathode which are provided on a side of the planarization layer away from the transparent substrate and are arranged in sequence, wherein the second anode is connected to a source electrode or a drain electrode of the second source/drain electrode layer through a third via hole penetrating the planarization layer and the inorganic protective layer.

15. The display apparatus according to claim 12, wherein a plurality of pixel structures arranged in array are further provided in the second display region, and a distribution density of the plurality of pixel structures in the second display region is less than the distribution density of the plurality of pixel structures in the third display region.

16. The display apparatus according to claim 11, wherein the inorganic protective layer is a silicon oxide layer.

* * * * *